United States Patent

Chung

[11] Patent Number: 5,785,307
[45] Date of Patent: Jul. 28, 1998

[54] PRINTED CIRCUIT BOARD FIXTURE

[76] Inventor: Henry Chung, 3478 Del Norte Dr., San Jose, Calif. 95132

[21] Appl. No.: 572,537

[22] Filed: Dec. 14, 1995

[51] Int. Cl.$^6$ ........................................... B25B 1/00
[52] U.S. Cl. .................... 269/254 CS; 269/903; 269/43
[58] Field of Search ................. 269/56, 254 CS, 269/315, 316, 317, 903, 909, 55, 74, 77, 78, 111, 134, 254 R, 254 DF, 254 D, 289 R, 237, 24, 303, 290, 293, 305

[56] References Cited

U.S. PATENT DOCUMENTS

| | | | |
|---|---|---|---|
| 390,751 | 10/1888 | Carroll | 269/254 R |
| 1,558,929 | 10/1925 | Schmutz | 269/237 |
| 2,284,972 | 6/1942 | Carson | 269/254 CS |
| 4,706,602 | 11/1987 | Polacek | 118/63 |

FOREIGN PATENT DOCUMENTS

| | | | |
|---|---|---|---|
| 48238 | 3/1985 | Japan | 269/305 |
| 16371 | of 1886 | United Kingdom | 269/111 |

Primary Examiner—Robert C. Watson
Attorney, Agent, or Firm—Robert Samuel Smith

[57] ABSTRACT

A frame for supporting a printed circuit board during manufacturing operations having a frame with at least one open area and frame holes arrayed around an edge of open area; a flat finger for each frame hole and having a mounting hole located in the middle of the finger; a stool for each finger having a stem and a cap on one end and a helical spring biasing the finger toward the frame. The stem passes through the mounting hole of the respective finger and frame hole. Each stem has a retaining member on an end of the stool distal from the cap such that each stool is retained in its respective hole by the cap against the finger on one end and the retaining means against the frame on the other side of the finger and frame so that each finger is rotatably mounted on the frame. A helical spring on the stem in the frame hole biases the finger toward the frame so that, when the finger is oriented in a first direction with a long dimension of the finger perpendicular to an edge of the open area, a printed circuit board may be secured against the frame by fingers pressing the printed circuit board against the frame with an area of the printed circuit board exposable to heat for solder reflow. The printed circuit board is released from the frame when the finger is rotated about the stem to an orientation parallel to the edge of the area.

8 Claims, 2 Drawing Sheets

PRINTED CIRCUIT BOARD FIXTURE

FIELD OF THE INVENTION:

This invention relates to fixtures for manufacturing printed circuit boards and particularly to a fixture with a device for clamping the boards which permits transferring the board through several operations, including surface screen solder printing, surface mount procedures and, solder reflow.

BACKGROUND AND PRIOR ART:

The manufacture of printed circuit boards (PCB) is accomplished in several distinct steps that include:

1. Holes are drilled through a printed circuit board blank panel.
2. The required solder pattern is screen printed onto the panel, and the panel is exposed to an etching solution that leaves the copper traces of the circuit on the panel.
3. Circuit components including integrated circuits, resistors, etc. are mounted on the side of the panel opposite the copper laminate by inserting the leads of the components into the holes in the board.
4. The panel is subjected to a hot air blast such as to convert the printed particulate solder pattern to a solid metal form.

The intensely competitive nature of the electronics industry motivates members of the industry to develop improved fixtures and handling techniques that economize the entire process. A number of these improvements are disclosed in the literature.

For example, U.S. Pat. No. 4,706,602 to Polacek discloses a solder coater board clamp which includes a plurality of coplanar first fingers cooperating with a plurality of coplanar second fingers spring loaded to perform a "scissors action" to clamp onto the edge of a PCB in order to dip the board into a molten solder bath.

According to the present art, the manufacturing steps are carried out in separate fixtures, each fixture being constructed to support the board in one of the steps.

OBJECTS:

It is an object of this invention to provide a fixture for supporting one or more panels through the steps of screen print, surface mounting and solder reflow.

It is another object that the fixture have good resistance to the heat from repeated exposure to wave soldering.

It is another object that the edge of the fixture be contoured to mate with any of the manufacturing machines presently on the market.

It is another object that the fixture be inexpensive.

SUMMARY:

This invention is directed toward a flat frame with flat fingers rotatable effectively in the plane of the frame such that, in one orientation, each finger engages an edge of a printed circuit board (PCB) laid against a top side of the frame so that the frame is firmly supported for the surface mounting operation and in another orientation of the fingers, each finger is locked out of contact with the PCB with the top service of the finger at least flush or below the top surface of the board permitting the board to be screen printed using state of the art screen printing machines and providing for convenient separation of the PCB from the frame. The panel is preferably fabricated of polyester impregnated fiber glass to provide low heat conductivity. The surfaces of the frame are coated with a heat resistant coating to prolong the life of the frame.intermittently exposed to the the solder bath.

Figure 1:
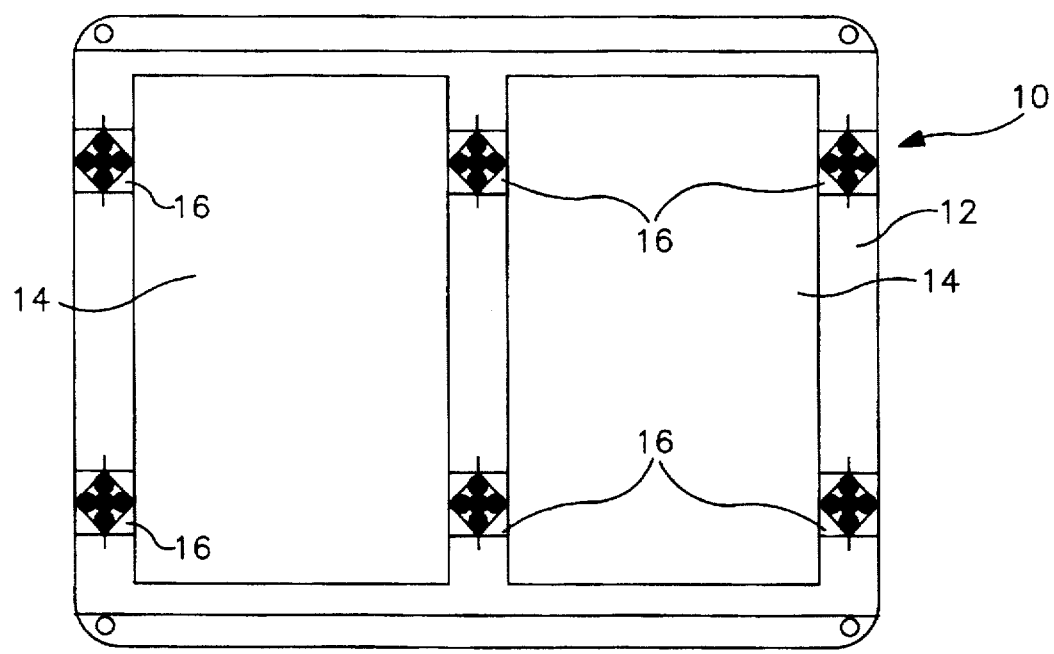
FIG. 1 shows a top view of the frame.

DESCRIPTION OF PREFERED EMBODIMENTS:

Turning now to a discussion of the drawings, FIG. 1 shows a top view of the fixture 10 against which two PCBs are secured as the fixture 10 carries the PCBs through the manufacturing steps. (PCBs are not shown in FIG. 1.) There is shown a frame 12 having openings 14, one for each PCB. Six clamps 16 are shown for securing the PCB to the frame.

Figure 2:
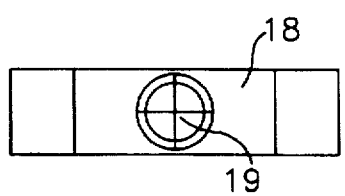
FIG. 2 shows a top view of a clamping finger.
Figure 3:
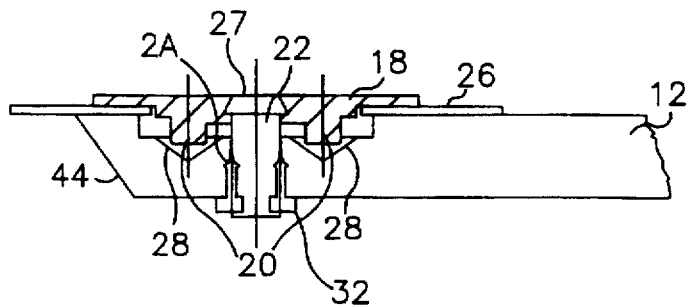
FIG. 3 shows a sectional view of a finger clamp.
Figure 4:
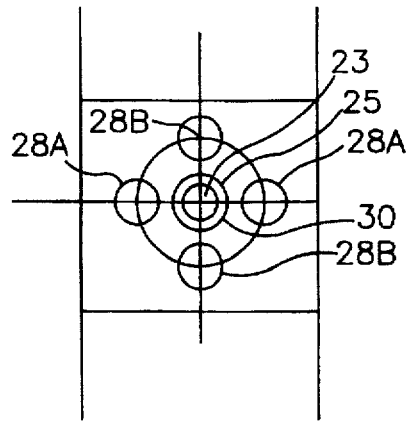
FIG. 4 shows details of the indents at each clamp location of the frame.

Details of one embodiment of the clamp are shown to better advantage in the top view of FIG. 2, and the sectional view of FIG. 3. The finger 18 of each clamp 16 has a generally rectangular shape with bosses 20. A mounting hole 19 in the center of the finger 18 acts with spring 24 to bias the finger 18 toward the frame so that, in one orientation, the finger secures the edge of a PCB 26 against the top surface of frame 12. The finger 18 is temporarily fixed in this orientation by engagement of bosses 20 with recesses 28 in the frame 12. FIG. 4 shows to best advantage the four recesses 28 of each clamp 16 in frame 12 as well as the frame hole 23 for stool 22 and the shoulder 30 which acts as stop for the head of stool 22. A retainer ring 32 (FIG. 3) retains the stool in the hole through the panel 12.

When the finger 18 is oriented so that bosses 20 engage recesses 28A, the finger 18 secures the PCB 26 firmly to the frame as required in the surface mounting operation. When the finger is oriented 90°, the finger is temporarily secured in that orientation by engagement of the bosses 20 with recesses 28B and the top surface of the finger 18 is flush or below the top surface (to be screen printed) of the PCB 26 which makes the top surface of the PCB 26 more readily accessible for the screen printing operation.

Figure 5:
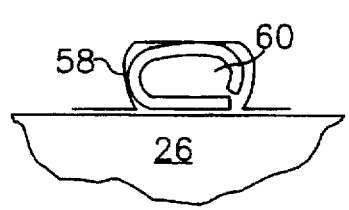
FIG. 5 shows a clamp of the prior art.
Figure 6:
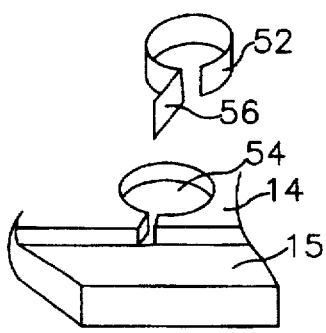
FIG. 6 shows a recess in the board for receiving a clamp.
Figure 7:
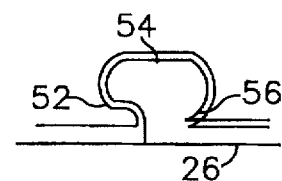
FIG. 7 shows a clamp for insertion of the recess of FIG. 7.

FIGS. 6–7 show another embodiment for securing the PCB to the frame which provides more support and is therefore an improvement over the prior art arrangement shown in FIG. 5. FIG. 6 is a perspective view showing a short spring strap 52 shaped to be inserted in a recess 54 at the edge of the frame 14. Frame 14 has a ledge 15 for supporting printed circuit board 26. FIG. 7 is a top view of the frame 14 (cutaway) showing the spring 52 inserted into the recess 54 with an end of the spring bearing against a PCB. The spring of FIG. 6 is an improvement over the arrangement of FIG. 5 (prior art) because the angle of the contacting edge 56 bearing against the edge of the board secures the board more reliably than the arrangement of the prior art shown in FIG. 5,.where a section of flat surface of spring 58 in recess 60 bears against the edge of PCB 26.

Figure 8:
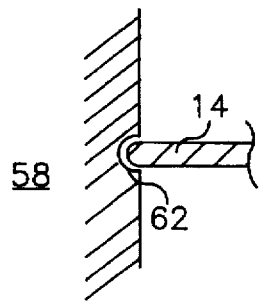
FIG. 8 shows a groove track.
Figure 9:
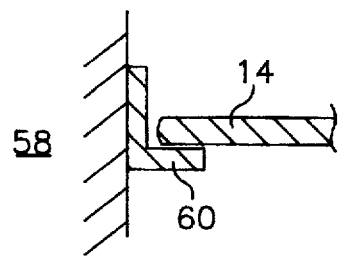
FIG. 9 shows a ledge track.

According to the present state of the art, the two outer edges of the frames carrying the PCB's are supported by a pair of parallel tracks, one track for each outer edge of the frame. Two styles of tracks are presently used in the industry whose arrangement for supporting the outer edges of the frame are shown in the cross sectional views of FIG. 8. and 9. One track style (FIG. 9) is a ledge formed in the side of the wall 58 of the machine that supports relatively thick frames 14 where the thickness is selected to prevent warpage of the frame due to the reflow step. FIG. 8 shows the second style to be a groove 62 in the wall 58 that supports a thin frame such as are used in print operations that are not subject to heat.

Figure 10:
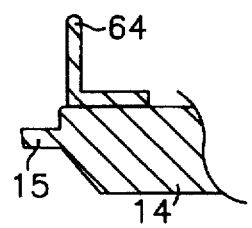
FIG. 10 shows the edge of the frame according to the present embodiment.

FIG. 10 is a sectional view of an edge of the frame according to an embodiment of the invention which accommodates both situations. The frame 14 of this embodiment has an angle stiffener 64 mounted along an edge of the frame. The thickness of the frame at the edge 15 has been reduced so that the edge 15 capable of being supported by either a groove or ledge and the stiffener prevents warpage. the stiffener is preferably titanium which is light weight and temperature resistant.

The solder reflow process requires that the fixture for supporting the PCB wave conduct little heat. Therefore the preferred material for fabricating the panel is polyester impregnated fiber glass. However, the durability of the fixture is limited by exposure of the surface of the fixture to heat. It is therefore an embodiment of this invention to apply of a heat resistant coating to the surface of the fixture. A preferred coating for this purpose is a silicate coating applied by "painting" the surface with "water glass". Water glass is a common coating and adhesive material consisting of alkali silicates dissolved in water. Another prefered coating for this purpose is polyphenylene sulfide. It is also an embodiment of this invention that the coating applied to the frame and figers be antistatic. this property can be obtained, for example, by mixing the water glass or polyphenylene sulfide to be applied with an antistatic agent such as a quaternary amine.

The foregoing paragraphs describe a fixture in which a PCB is secured to the surface of a frame by clamping means that is characterized by a minimal dimension perpendicular to the surface of the PCB thereby providing that the fixture can be used conveniently in successive manufacturing operations. Variations and modifications of the embodiments may occur after reading the specification and studying the drawings which are within the scope of the invention. I therefore wish to define the scope of my invention by the appended claims.

What is claimed is:

1. A fixture for supporting a printed circuit board during manufacturing operations which comprises:

a frame having at least one open area and a plurality of frame holes arranged around an edge of said at least one open area;

a plurality of flat fingers, one finger for each one of said frame holes, each finger having a mounting hole located intermediate ends of said each finger;

a plurality of stools, each stool having a stem and a cap on one end of said stem;

one stool for each one of said fingers;

said stem passing through said mounting hole of said each one of said fingers respectively and passing through one of said frame holes;

each stem having a retaining means on an end of said stool distal from said cap for retaining each said stool in said respective frame hole by said cap against said finger on one side of said finger and said frame and by said retaining means against said frame on another side of said finger and said frame whereby each said finger is rotatably mounted on a first surface of said frame;

a helical spring on said stool in said respective frame hole of said finger biasing said finger towards said frame whereby, when said finger is oriented in a first direction with a long dimension of said finger substantially perpendicular to an edge of said open area of said frame, a printed circuit board is enabled to be secured against said first surface of said frame by each one of said plurality of fingers pressing said printed circuit board against said first surface of said frame with an area of said printed circuit board exposable to a burst of heated gas and whereby said printed circuit board is released from said frame when said plurality of figers are rotated about said respective stem to a second orientation perpendicular to said first orientation.

2. The fixture of claim 1 wherein each said finger has two bosses located on a first surface of said finger facing said frame and the surface of said frame facing said finger has two pairs of recesses operably arranged and a thickness of said finger selected such that when said finger has a long dimension parallel to said edge of said open area, said bosses engage one pair of said recesses and said finger is detachably secured away from said open area permitting placement of said printed circuit board on said fixture and a second surface of said finger is flush with a surface of said printed circuit board such that screen printing on said printed circuit board is facilitated and when said finger is then rotated to an orientation perpendicular to said edge of said frame, said bosses engage said other pair of recesses with said fingers pressing said printed circuit board against said frame.

3. The fixture of claim 1 which comprises: # at least one elongate angle member mounted on said first surface of said frame along an outside edge of said frame such as to confer stiffness in said fixture, and said outside edge is configured to mate with both a ledge and a groove comprising a track means for guiding said frame through a manufacturing process.

4. The fixture of claim 3 wherein said elongated angle member is made of titanium.

5. The fixture of claim 1 wherein said frame is made from polyester impregnated fiberglass.

6. The fixture of claim 1 wherein said spring is made from 7-17—stainless steel alloy.

7. The fixture of claim 1 wherein said frame is coated with a coating material selected from a group of coating materials that consists of a silicate and polyphenolene sulfide.

8. A fixture as in claim 1 wherein said frame and fingers are made of fiberglass coated with a coating that is antistatic.

* * * * *